(12) United States Patent
Bazarsky et al.

(10) Patent No.: US 12,355,468 B2
(45) Date of Patent: Jul. 8, 2025

(54) DNA STORAGE ERROR CORRECTION CODE ARCHITECTURE FOR OPTIMIZED DECODING

(71) Applicant: Western Digital Technologies, Inc., San Jose, CA (US)

(72) Inventors: Alexander Bazarsky, Holon (IL); Ran Zamir, Ramat Gan (IL); David Avraham, Even Yehuda (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 18/528,771

(22) Filed: Dec. 4, 2023

(65) Prior Publication Data

US 2025/0183915 A1    Jun. 5, 2025

(51) Int. Cl.
*H03M 13/11* (2006.01)
*G06N 3/123* (2023.01)
*H03M 13/00* (2006.01)

(52) U.S. Cl.
CPC ......... *H03M 13/1111* (2013.01); *G06N 3/123* (2013.01); *H03M 13/611* (2013.01)

(58) Field of Classification Search
CPC .. H03M 13/1111; H03M 13/611; G06N 3/123
See application file for complete search history.

(56) References Cited

U.S. PATENT DOCUMENTS

| | | | |
|---|---|---|---|
| 2017/0187390 A1* | 6/2017 | Le Scouarnec | G11C 13/02 |
| 2019/0355442 A1* | 11/2019 | Merriman | G01N 27/4145 |
| 2022/0237470 A1 | 7/2022 | Vishwakarma et al. | |
| 2023/0036568 A1 | 2/2023 | Roquet et al. | |

FOREIGN PATENT DOCUMENTS

CN    109300508 A    2/2019

OTHER PUBLICATIONS

International Search Report and Written Opinion from International Application No. PCT/US2024/040022, mailed Nov. 11, 2024, 9 pages.

(Continued)

*Primary Examiner* — Thien Nguyen
(74) *Attorney, Agent, or Firm* — DENTONS Durham Jones Pinegar

(57) ABSTRACT

A DNA-based storage system implements a sub-code architecture for error correction capability (ECC) purposes. The sub-code architecture enables a long DNA strand to be divided into two or more short DNA strands. Each short DNA strand has its own unique parity information. Additionally, each short DNA strand is separately decodable from the other short DNA strands. The parity information associated with a particular short DNA strand is used to correct any errors that occur or are detected during the decoding process. However, if the decoding and error correction processes are not successful using the parity information associated with the particular short DNA strand, global parity information is used to decode the particular short DNA strand and correct the errors. Global parity information includes information from each short DNA strand and the parity information associated with each short DNA strand.

20 Claims, 5 Drawing Sheets

(56) References Cited

OTHER PUBLICATIONS

Chandak, Shubham, et al. "Improved read/write cost tradeoff in DNA-based data storage using LDPC codes." 2019 57th Annual Allerton Conference on Communication, Control, and Computing (Allerton) Sep. 24-27, 2019 (pp. 147-156). IEEE.

Heckel, R., Mikutis, G. & Grass, R.N. "A Characterization of the DNA Data Storage Channel." Sci Rep Jul. 4, 2019;9(1):9663. https://doi.org/10.1038/s41598-019-45832-6.

Fei, Peng, and Zhiying Wang. "LDPC codes for portable DNA storage." In 2019 IEEE International Symposium on Information Theory (ISIT), pp. 76-80. IEEE, 2019. doi: 10.1109/ISIT.2019.8849814.

* cited by examiner

DNA STORAGE ERROR CORRECTION CODE ARCHITECTURE FOR OPTIMIZED DECODING

BACKGROUND

DNA-based storage systems are emerging as a promising storage technology. DNA is a long molecule made up of four nucleotide bases—adenine (A), cytosine (C), thymine (T) and guanine (G). For storage purposes, base units (ACTG) of synthesized DNA can be used to encode information—similar to how a string of ones and zeros represent data in traditional electronic storage systems. The encoded information may then be stored, subsequently accessed and decoded.

For example, DNA-based storage systems typically store DNA data using three main processes—synthesis (or writing) in which the base units of synthesized DNA are joined together to produce a desired DNA string; storage, in which the DNA string is stored in a DNA-based storage medium; and sequencing (or reading), in which the DNA string is translated to binary/digital data.

While DNA-based storage systems are more dense than traditional electronic data storage systems, DNA-based storage systems are more prone to errors. For example, during synthesis, storage and/or sequencing, various symbols in the DNA string may be inserted or deleted (errors known as an "indels," for "insertions" or "deletions"). In other examples, during synthesis, storage and/or sequencing, one symbol (or multiple symbols) in the DNA string may be substituted for another symbol (errors known as "substitutions").

During an encoding process and/or a decoding process, an inner code is typically used to correct substitution errors while an outer code is used to correct indel errors. However, having separate codes for correcting different errors adds an additional layer of complexity to the encoding and decoding processes. Additionally, when parity information is included as part of the inner code and the outer code, the outer code is associated with its own parity information and the inner code is associated with its own parity information. During an encoding and/or a decoding process, the inner code utilizes its parity information and the outer code uses its parity information, which limits the correction capabilities of the DNA-based storage system.

Accordingly, it would be beneficial to increase the error correction capabilities of DNA-based storage systems by reducing the complexity of error correction processes while increasing an amount of parity information that is available for these processes.

SUMMARY

The present application describes a DNA-based storage system that implements a sub-code architecture. The sub-code architecture enables a long DNA strand to be divided into two or more short DNA strands, each with its own unique parity information. The combination of each short DNA strand and its associated parity information is referred to herein as a "sub-code." Each of the short DNA strands is separately decodable from the other short DNA strands. Additionally, the parity information associated with a particular short DNA strand is used during the decoding process.

However, if the decoding process was unsuccessful and/or errors within the short DNA strand are not correctable using its own parity information, global parity information is used to decode and/or correct the errors in the short DNA strand.

In an example, the global parity information includes information from all of the sub-codes that are associated with the long DNA strand. For example, if the long DNA strand is broken up into ten short DNA strands, and each of the short DNA strands is associated with its own parity information, the global parity information includes all ten short DNA strands and the respective parity information of each short DNA strand.

Accordingly, aspects of the present disclosure describe a DNA-based data storage system that includes a control system operable and a decoding system. In an example, the control system identifies a DNA strand for decoding. The DNA strand is associated with global parity information. The decoding system separates the DNA strand into two or more short DNA strands and decodes at least one short DNA strand of the two or more short DNA strands using local parity information that is unique to the at least one short DNA strand.

Other examples describe a method of decoding a DNA strand that includes identifying the DNA strand. In an example, the DNA strand is associated with global parity information. The DNA strand is separated into a first short DNA strand and a second short DNA strand. At least the first short DNA strand is decoded using local parity information associated with the first short DNA strand. A determination is made as to whether the decoding of the first short DNA strand was successful. If it is determined the decoding of first short DNA strand was unsuccessful, the first short DNA strand is decoded using the global parity information.

A DNA-based data storage system is also described. In an example, the DNA-based data storage system includes means for decoding a DNA strand using local parity information associated with the DNA strand. The DNA-based storage system also includes means for determining whether the decoding of the DNA strand was successful. In an example, the DNA-based data storage system also includes means for decoding the DNA strand using global parity information based, at least in part, on a determination that the decoding of the DNA strand using the local parity information was unsuccessful.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1:
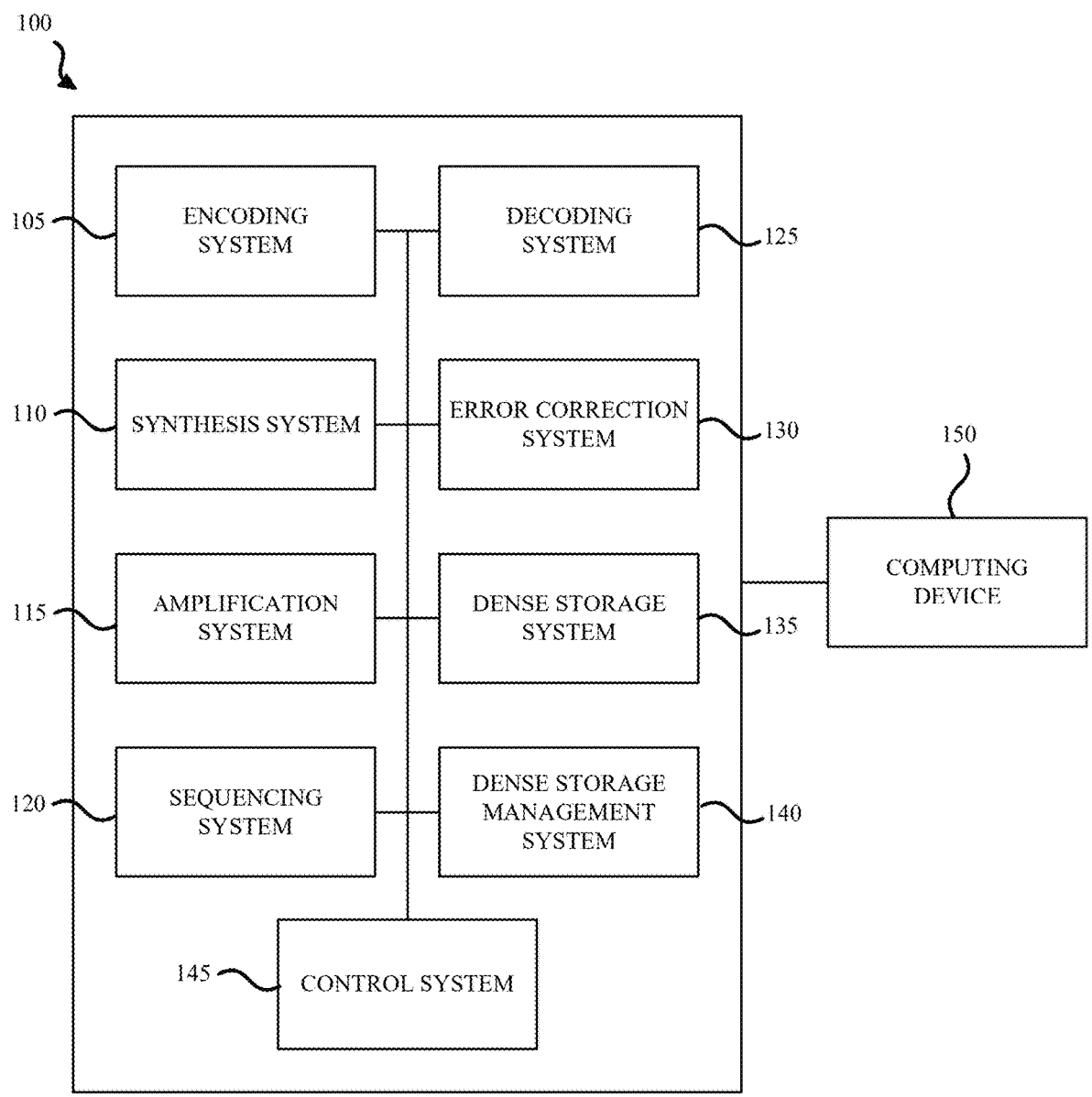
FIG. 1 illustrates a data storage system according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. Accordingly, examples may take the form of a hardware implementation, an entirely software implementation, or an implementation combining software and hardware aspects. The following detailed description is therefore not to be taken in a limiting sense, and the scope of the present disclosure is defined by the appended claims and their equivalents.

In a DNA storage channel, several different types of errors can occur during the synthesis and sequencing processes. One example type of error is a substitution error. When a substitution error occurs, a base that was intended to be one particular DNA nucleotide (e.g., an 'A', 'T', 'G', or 'C') is swapped with one of the other nucleotides. Since most DNA encodings use these nucleotides to represent different binary values (e.g., 'A'=00, 'T'=01, 'G'=10, 'C'=11), a substitution of one nucleotide for another, if left uncorrected, may cause some of the data to be incorrectly recreated during the decoding process.

Indel type errors ("inserts" and "deletes") involve either adding a base to, or deleting a base from, the DNA sequence. Such indel errors induce a shift in the alignment of the remaining bases. For example, a single insert error can not only introduce two additional bits into the data stream, but because the DNA sequence is an ordered structure of encoded data, this alignment shift of just one base or two bits shifts all of the other bits to the back by two places. Such misaligned data can cause the decoding operation to generate garbled data that may be useless to the end user.

To address these errors, DNA-based storage systems typically utilize an outer code and an inner code. For example, during an encoding process and/or a decoding process, an inner code is used to correct substitution errors while an outer code is used to correct indel errors.

The outer code adds error correction capabilities by duplicating and replicating various DNA strands. This allows for reconstruction of the original data even if parts of the DNA strand are missing. Typically, the outer code includes outer parity information (e.g., the replicated DNA strands). The outer parity information is used to correct any indel errors that may occur or are detected during an encoding process or a decoding process.

The inner code specifies how the data that is to be stored by the DNA-based storage system is to be represented by the DNA nucleotides that make up the various DNA strands. Typically, the inner code is also associated with parity information that is used to correct any substitution errors that may occur or otherwise be detected during an encoding and/or a decoding process.

However, having separate codes for correcting these various errors adds an additional layer of complexity to the encoding and decoding processes. Additionally, the division of parity information between inner codes and outer codes limits the correction capabilities of the DNA-based storage system.

In order to address the above, the present disclosure describes a DNA-based storage system that implements a sub-code architecture. The sub-code architecture may increase the error correction capabilities of an error correction system of the DNA-based storage system. For example, during an encoding/synthesis process, a long DNA strand is divided into two or more short DNA strands. Each of the short DNA strands is associated with its own unique parity information and is separately decodable. As previously explained, the combination of each short DNA strand and its associated parity information is referred to herein as a "sub-code." The parity information associated with a particular short DNA strand is used during a decoding process in which the particular short DNA strand is decoded.

However, if the decoding process was unsuccessful and/or errors within the short DNA strand are not correctable using the parity information associated with the short DNA strand, global parity information is used to decode and/or correct the errors contained or detected in the particular short DNA strand. In an example, the global parity information includes information from all of the sub-codes that are associated with the long DNA strand.

In another example, during an encoding and/or a decoding process, system parity information (and/or global parity information) may be divided among all of the short DNA strands. In an example, the system parity information includes global parity information and local parity information associated with each short DNA strand. For example, each short DNA strand may be associated with its own, "local" parity information that is unique to each short DNA strand. Each short DNA strand may also be associated with at least a portion of the global parity information and/or at least a portion of the system parity information. In such an example, the system parity information (e.g., the combination of the global parity information and the local parity information) is used to correct both substitution errors and indel errors, thereby reducing or eliminating the need for an inner code and an outer code.

In such examples, the division of the system parity information is based, at least in part, system requirements of the DNA-based storage system, throughput and quality of service requirements. For example, if the DNA-based storage system is demanding higher throughput, the short DNA strand should have access to more local parity information (when compared to the global parity information and/or system parity information). However, if the DNA-based storage system is demanding better correction capabilities (e.g., when compared to higher throughput), there would be more parity allocated to global parity and/or system parity.

Accordingly, the present application includes many technical benefits in the area of DNA storage and retrieval, including, but not limited to, improving error detection and remediation during decoding, allowing for denser storage, enabling the use of longer DNA strands, and reducing the complexity and error correction during the encoding and decoding processes.

These various benefits and examples will be described in greater detail below with reference to FIG. 1-FIG. 5.

FIG. 1 illustrates a data storage system 100 according to an example. The data storage system 100 may be used to store data that is "more dense" when compared to data that is stored in a traditional electronic storage medium such as, for example, hard disks, optical disks, flash memory, and the like. For example, the data storage system 100 stores synthetic DNA-based data.

DNA includes four naturally occurring nucleotide bases: adenine (A), cytosine (C), thymine (T) and guanine (G). In order to store data in synthetic DNA, received data is encoded to the various nucleotide bases. For example, data received as ones and zeros is encoded or otherwise mapped to various sequences of the synthetic DNA nucleotide bases. Once encoded, the data may be synthesized (e.g., written) and stored (e.g., in a dense storage system). To retrieve the stored data, the synthetic DNA molecules are sequenced (e.g., read) and subsequently decoded. As part of the decoding process, the synthetic DNA nucleotide bases are remapped to the original ones and zeros. Each of these processes will be discussed in greater detail below. Effectively, the binary system of 0's and 1's (e.g., two states of a binary "base-2" numeral system, represented in one conventional binary bit) are represented in a quaternary system of A's, C's, T's, and G's (e.g., four states of a quaternary "base-4" numeral system, represented by a single nucleotide of DNA) when the source binary (e.g., base-2) data is encoded in the quaternary (e.g., base-4) system of nucleotides.

Although synthetic DNA-based data and associated DNA-based storage systems are specifically mentioned, the systems and methods described herein may be applicable to traditional electronic storage mediums/systems and/or traditional digital/binary data.

In an example, the data storage system 100 includes an encoding system 105. The encoding system 105 receives digital/binary information and/or data (e.g., binary ones and zeros, or "base-2") from a computing device (e.g., computing device 150) or from another source. This data may be referred to herein as "input data," "source data," or "original data." Such input is initially stored and represented in conventional base-2 binary (e.g., when not embodied in DNA).

When the input data is received, the encoding system 105 converts or maps the ones and zeros of the original data into various DNA sequences using the synthetic DNA nucleotide bases A, C, T, and G. For example, the DNA nucleotide base "A" may be assigned a value 00, the DNA nucleotide base "C" may be assigned a value 01 (base-2), the DNA nucleotide base "T" may be assigned a value 10 and the DNA nucleotide base "G" may be assigned a value 11. These binary-to-quaternary mappings, and their complements, are used in the examples provided herein, but it should be understood that any similar mapping may be used.

In one example, the encoding system 105 performs a "direct encoding" process when preparing input data for memorialization in DNA. Direct encoding includes the binary-to-quaternary mappings to translate or convert each pair of bits into a single nucleotide. For example, input data of 010010110100 may be directly encoded as a DNA sequence or DNA strand of CATGCA. This data, when embodied in DNA form, may be referred to herein as "DNA data." Such direct encoding of data yields one nucleotide of DNA data for every two bits of input data.

Figure 2:
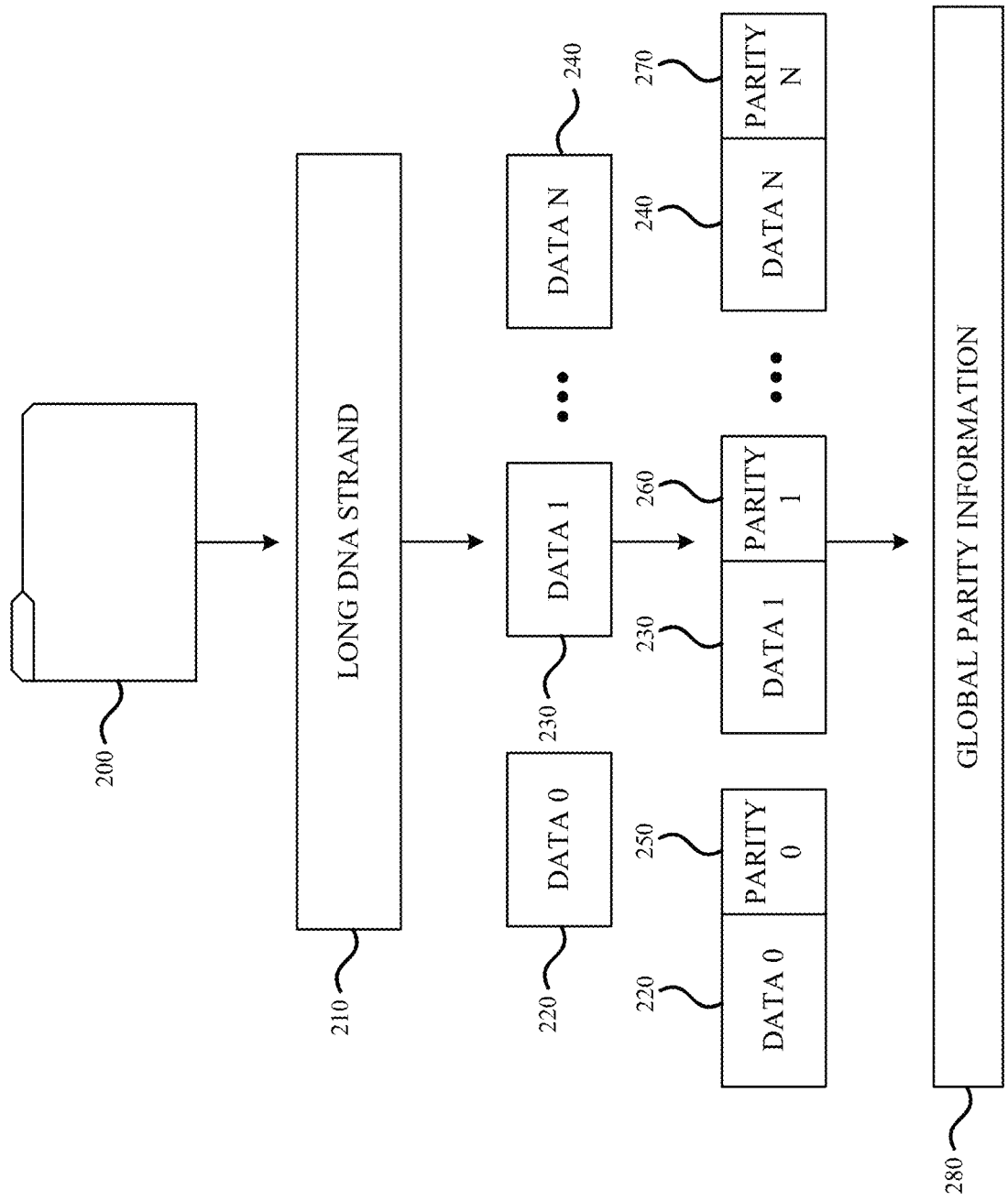
FIG. 2 illustrates how a file is segmented and encoded as part of a DNA synthesis process.

FIG. 2 illustrates how a file 200 is segmented and encoded as part of a DNA synthesis process. In an example, the file 200 may be segmented and encoded using the encoding system 105 shown and described with respect to FIG. 1. In an example, a computing device (e.g., the computing device 150 (FIG. 1)) receives the file 200. The file 200 may be any file (e.g., an image, a document) having digital/binary information and/or data.

When the file 200 is received, the encoding system segments the data into various blocks or smaller portions of data. Each segment of data may be replicated or duplicated. In an example, the replicated information may be referred to as parity information and is used for error correction purposes and/or to reconstruct the original data during a synthesis and/or a sequencing process.

The encoding system also translates or maps the data in each data segment to various DNA strands using the synthetic DNA nucleotide bases A, C, T, and G. In the example shown in FIG. 2, this data is represented as long DNA strand 210. Although a single long DNA strand 210 is shown, the encoding system may generate multiple long DNA strands 210.

In an example, the encoding system implements a sub-code architecture during encoding, decoding and/or error correction. As part of the sub-code architecture, the long DNA strand 210 is divided or segmented into two or more short DNA strands. For example, the long DNA strand 210 is divided into N short DNA strands represented as Data 0 220, Data 1 230 and Data N 240.

Additionally, the encoding system also generates and/or associates each short DNA strand with parity information. In an example, each short DNA strand is associated with its own unique parity information. For example, Data 0 220 is associated with Parity 0 250, Data 1 230 is associated with Parity 1 260 and Data N 240 is associated with Parity N 270.

In an example, the combination of each short DNA strand (or the data associated with each short DNA strand) and its associated parity information is referred to as a sub-code. Additionally, each short DNA strand may be encoded, decoded and/or error corrected separately from the other short DNA strands. For example, Data 0 220 may be encoded/decoded separately from Data 1 230. The parity information associated with each short DNA strand is used to correct any errors that may occur during an encoding/synthesis process, data storage, and/or a sequencing process.

However, as will be described in greater detail herein, if the encoding and/or decoding process is unsuccessful, global parity information 280 is used to correct any errors that are detected during the encoding/decoding processes. In an example, the global parity information 280 includes data associated with some or all of the short DNA strands, along with the parity information associated with each short DNA strand.

For example, the global parity information 280 includes data associated with Data 0 220 and Parity 0 250, Data 1 230 and Parity 1 260 and Data N 240 and Parity N 270. Because the global parity information 280 includes all of the data associated with each short DNA strand and the parity information associated with each short DNA strand, the overall correction capability of the data storage device 100 is improved. In an example, the local parity information (e.g., the parity information associated with each short DNA strand) and the global parity information may be used to correct substitution errors and may replace the use of an inner code.

Figure 3:
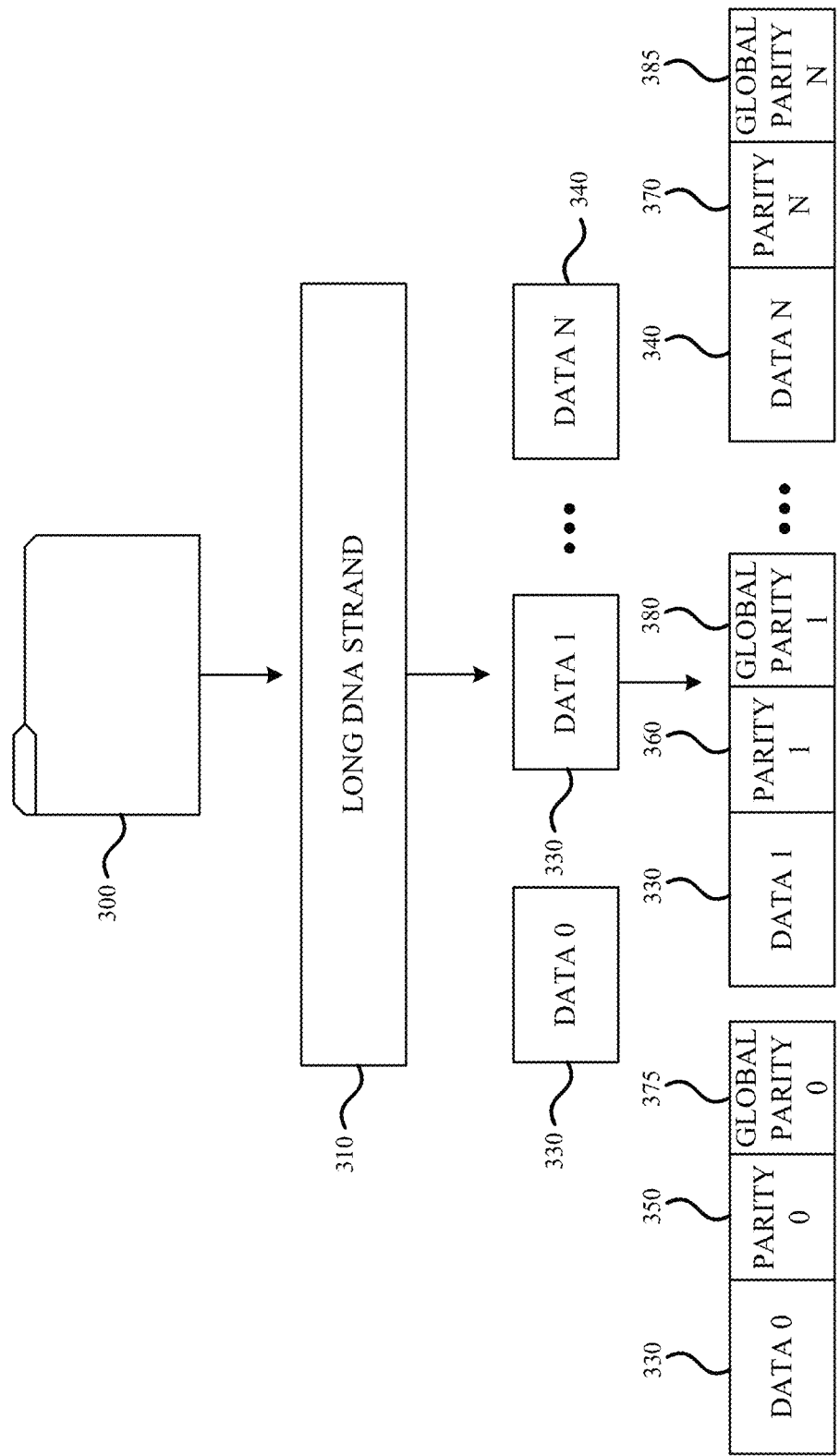
FIG. 3 illustrates how a DNA strand is associated with local parity information and global parity information according to an example.

However, in order to correct indel errors and/or replace an outer code, additional parity information may be needed. As such, FIG. 3 illustrates how a DNA strand is associated with local parity information and global parity information according to an example. In an example, the local parity information and the global parity information may be used to correct indel errors and/or substitution errors.

Similar to the example shown and described with respect to FIG. 2, a file 300 may be segmented and encoded using the encoding system 105 shown and described with respect to FIG. 1. When the file 300 is received, the encoding system segments the data into various blocks or smaller portions of data.

The encoding system also translates or maps the data in each data segment to various DNA strands using the synthetic DNA nucleotide bases A, C, T, and G. In the example shown in FIG. 3, this data is represented as long DNA strand 310. Although a single long DNA strand 310 is shown, the encoding system may generate multiple long DNA strands 310.

As with the previous example, the encoding system implements a sub-code architecture during encoding, decoding and/or error correction. As part of the sub-code architecture, the long DNA strand 310 is divided or segmented into two or more short DNA strands. For example, the long DNA strand 310 is divided into N short DNA strands represented as Data 0 320, Data 1 330 and Data N 340.

Additionally, the encoding system also generates and/or associates each short DNA strand with local parity information. In an example, each short DNA strand is associated with its own unique local parity information. For example, Data 0 320 is associated with Parity 0 350, Data 1 330 is associated with Parity 1 360 and Data N 340 is associated with Parity N 370.

Each short DNA strand may also be associated with global parity information. The global parity information may be similar to the global parity information 280 shown and described with respect to FIG. 2. However, as shown in FIG. 3, the global parity information is divided between each of the short DNA strands.

For example, Data 0 330 is associated with Global Parity 0 375, Data 1 340 is associated with Global Parity 1 380, and Data N 340 is associated with Global Parity N 385. In this example, each short DNA strand may be encoded, decoded and/or error corrected separately from the other short DNA strands using the local parity information and/or the global parity information.

In an example and as previously described, the combination of the global parity information and the local parity information is used to correct both substitution errors and indel errors. As such, the need for an inner code and an outer code may be eliminated.

In such examples, the division of the entire system's parity information is based, at least in part, on system requirements of the DNA-based storage system, throughput and quality of service requirements. For example, if a DNA-based storage system is demanding higher throughput, the short DNA strand should have access to more local parity information (when compared to the global parity information). However, if the DNA-based storage system is demanding better correction capabilities (e.g., when compared to the higher throughput), the short DNA strand should have access to more global parity information.

Referring back to FIG. 1, the data storage system 100 also includes a synthesis system 110. In an example, the synthesis system 110 writes or otherwise manufactures DNA strands based on the data provided by the encoding system 105. For example, using a series of chemical steps or processes, the synthesis system 110 creates and assembles the various DNA bases (e.g., the ACTG bases) to mirror the base-4 representation determined from the encoding process. Although chemical steps or processes are mentioned, the synthesis system 110 may use other synthesis techniques, and the synthesis system 110 includes both hardware components configured to create such DNA stands as well as software and/or electronic components for controlling those hardware components.

Continuing with the example above, during synthesis, since the digital data of 010010110100 is represented as CATGCA, the synthesis system 110 would first generate and/or identify a "C" base. An "A" base would then be generated and/or identified and be attached to the "C" base. A "T" base would then be generated and/or identified and be attached to the "CA" combination that was previously generated.

This process repeats until the entire DNA strand (e.g., CATGCA) is created. The terms "created", "generated", or "synthesized", and their variants, may be used interchangeably herein when referring to the making of an real-world synthetic strand of DNA. Further, the terms "storage material", "DNA strand", "DNA string" and "DNA sequence" may also be used interchangeably to refer to the synthetic DNA molecule created during the processes described herein, or to a mathematical representation of that DNA strand, depending on context.

When the synthesis process is complete, the DNA strand is stored in a physical storage medium such as, for example, a dense storage system 135 (e.g., one or more synthetic DNA molecules). The dense storage system 135 enables the synthesized DNA strand to be stored and subsequently accessed. In an example, any storage medium capable of storing DNA-based data may be used as the dense storage system 135.

Once the DNA strand has been stored, it may be subsequently accessed and prepared for sequencing (e.g., being read). As part of the preparation process, multiple copies of the DNA strand may be generated. In an example, an amplification system 115 of the data storage system 100 generates multiple copies of the DNA strand.

A sequencing system 120 may then be used to select and/or read one or more DNA strands from the dense storage system 135. For example, one or more DNA strands are initially sequenced and a consensus of the data is reached. The sequencing system 120 also determines and/or identifies an order of the DNA symbols (e.g., ACTG) in a DNA segment of a DNA strand that is being read. The sequencing system 120 may use a variety of sequencing methods such as, for example, sequencing by synthesis, nanopore sequencing, and the like.

When the DNA sequence has been read, a decoding system 125 maps the DNA symbols (e.g., in base-4) back to digital data (e.g., in base-2). For example, in "direct decoding," if the decoding system 125 receives CATGCA as the DNA strand, the decoding process performed by the decoding system 125 would return 010010110100 (e.g., using the corollary of the binary-to-quaternary mappings discussed above) to a requesting computing device (e.g., computing device 150). Other more complex decoding processes may be used. In some examples, the inverse of the encoding process used to make the DNA sequence may be used as the decoding process.

In an example and as part of the decoding process, one or more short DNA strands are identified and/or selected for decoding. For example, one or more of the short DNA strands that are identified and/or selected as part of the decoding process are one or more of the short DNA strands that were segmented from the long DNA strand 210 (FIG. 2) and/or the long DNA strand 310 (FIG. 3).

As previously explained, errors may occur during the synthesis process, the storage process and/or the sequencing process. These errors may be, for example, insertion and deletion ("indel") errors and/or substitution errors. For example, during a synthesis process in which the DNA sequence CATGCA is being synthesized, one or more symbols may be deleted or lost during the creation of the DNA molecule. As a result, a DNA sequence CTGCA may be stored by the dense storage system 135.

In another example, during a synthesis process in which the DNA sequence CATGCA is being synthesized, an additional symbol may be added. As a result, a DNA sequence CCATGCA may be stored by the dense storage system 135. Although a single insertion error and a single deletion error are discussed, multiple deletions and/or insertions may occur in a synthesis process. Additionally, these errors may occur during storage and/or during a sequencing process (e.g., during the writing/creating of the DNA molecule, or during the reading/sequencing of the DNA molecule).

In yet another example, during a synthesis process in which the DNA sequence CATGCA is being synthesized, the synthesis system 110 may substitute one symbol for another. As a result, a DNA sequence TATGCA may be stored in the dense storage system 135 instead of the DNA sequence CATGCA. In an example, multiple substitution errors (along with one or more indel errors) may occur during the synthesis process, during storage and/or during a sequencing process.

In order to address the above, the data storage system 100 may include an error correction system 130. The error correction system 130 may be part of the decoding system 125. The error correction system 130 may use various processes to detect and address indel errors and/or substitution errors.

In one example, indel errors may be addressed by generating multiple copies of a particular DNA sequence. Once generated, each of the copies of the DNA sequence are read and compared to generate a consensus codeword. For example, a first DNA symbol (or DNA segment consisting of multiple DNA symbols) of a first DNA sequence is compared with a first DNA symbol (or DNA segment consisting of multiple DNA symbols) from one or more of the copies of the DNA sequence. This process repeats for each DNA symbol (or DNA segment) in the DNA sequence.

The error correction system 130 may then determine, based on consensus data across all of the copies, which DNA symbol is the correct (or most correct) DNA symbol for that particular index (or DNA segment). For example, the most prominent DNA symbol in each index of the DNA sequence may be selected as the correct DNA symbol and a consensus codeword is generated for each DNA segment. The resulting consensus codeword is mapped to corresponding ones and zeros and is provided to the decoding system 125 (e.g., a low-density parity check (LDPC) decoder).

In an example, the consensus data generated by the error correction system 130 may be referred to herein as hard bit data or hard information. The error correction system 130 and/or the decoding system 125 described in the present application may also generate and use soft-bit data or soft information using information associated with the consensus data (or using information that is obtained while the consensus data is determined).

For example, once one or more of the short DNA strands are identified, the global parity information and/or the local parity information associated with each short DNA strand is used to correct any errors that may have occurred during the sequencing process. For example and referring back to FIG. 3, if Data 0 330 and Data 1 340 were selected for decoding, Parity 0 350 and Global Parity 0 375 is used as part of the decoding/error correction process for correcting any substitution error and/or indel errors for Data 0 330. Likewise, Parity 1 360 and Global Parity 1 380 is used as part of the decoding/error correction process for correcting any substitution errors and/or indel errors for Data 1 340.

In another example and referring to FIG. 2, when one or more of the short DNA strands are identified for decoding, the parity information associated with each short DNA strand is used to correct any substitution errors that may have occurred during the sequencing process. For example, if Data 0 230 and Data 1 240 were selected for decoding, Parity 0 250 is used as part of the decoding/error correction process for Data 0 230 and Parity 1 260 is used as part of the decoding/error correction process for Data 1 240.

The error correction system 130 and/or the decoding system 125 may then determine whether Data 0 230 and/or Data 1 240 were decoded successfully. For example, the error correction system 130 and/or the decoding system 125 may determine whether the parity information associated with each of Data 0 230 and Data 1 240 enabled Data 0 230 and/or Data 1 240 to be decoded successfully (e.g., decoded without any errors). If the data was successfully decoded and any errors were corrected, the decoded information is provided to a requesting device (e.g., computing device 150).

For example, if Data 0 220 was successfully decoded (and/or any errors were corrected) with Parity 0 250 and Data 1 230 was successfully decoded with Parity 1 260, Data 0 220 and Data 1 230 would be provided to the requesting device. However, if Data 1 230 was successfully decoded with Parity 1 260 and Data 0 220 was unsuccessfully decoded, the decoding system 125 and/or the error correction system 130 initiate a second decoding process on the DNA strands (e.g., Data 0 220) that were unsuccessfully decoded.

In an example, the second decoding process uses global parity information (e.g. global parity information 280 (FIG. 2)). As previously discussed, the global parity information includes data that is associated with some or all of the shorter DNA strands, along with the parity information associated with each shorter DNA strand.

For example, the global parity information 280 includes data associated with Data 0 220 and parity 0 250, Data 1 230 and Parity 1 260 and Data N 240 and Parity N 270. Because the global parity information 280 includes all of the data associated with each short DNA strand and the parity information associated with each short DNA strand, the overall correction capabilities of the DNA-based data storage device is improved.

In an example, as part of the second decoding process, the global parity information 280 is decoded. The decoded global parity information is then used to decode and/or correct any errors on the short DNA strands that were unsuccessfully decoded in the first decoding step. For example, if Data 0 220 was unsuccessfully decoded in the first decoding process, Data 0 220 would be decoded and/or error correction would be performed using the global parity information.

In an example, creation, encoding, decoding and division of the global parity information 280 may be part of the same encoding/decoding processes. In another example, creation, encoding, decoding and division of the global parity information 280 may be part of different encoding/decoding processes. For example, when the global parity information 280 is initially generated, the global parity information 280 may be divided among the various short DNA strands such as shown in FIG. 3. In another example, the global parity information 280 may be divided among the various short DNA strands once substitution errors are corrected for a short DNA strand and subsequent indel errors need to be corrected.

Referring back to FIG. 1, the data storage system 100 also includes a dense storage management system 140. In an example, the dense storage management system 140 controls the various operations and/or processes that are carried out by and/or on the dense storage system 135. The operations and/or processes may include the mechanics of storage and retrieval of the DNA data and/or information storage management (e.g., making copies of data, deleting data, selecting subsets of the data, etc.).

The data storage system 100 may also include a control system 145. In an example, the control system 145 includes at least one processor, at least one controller and/or other such control circuitry. The control system 145 may include circuitry for executing instructions from the computing device 150 (or from another source) and/or providing instructions to the various subsystems of the data storage system 100. In an example, one processor or controller may control one or more aspects/features described herein while another processor controller may control other aspects/features described herein.

This process of converting the input data (base-2) into DNA molecule(s) (base-4) and subsequently converting the DNA molecule(s) (base-4) into output data (base-2), including any of the interim processes that the data and/or DNA molecules undergo, may be referred to herein as "the DNA storage channel." It should be understood that, in these examples, it is an objective of the DNA storage channel and the systems and methods described herein to generate output data that is as close to identical to the input data as possible.

Figure 4:
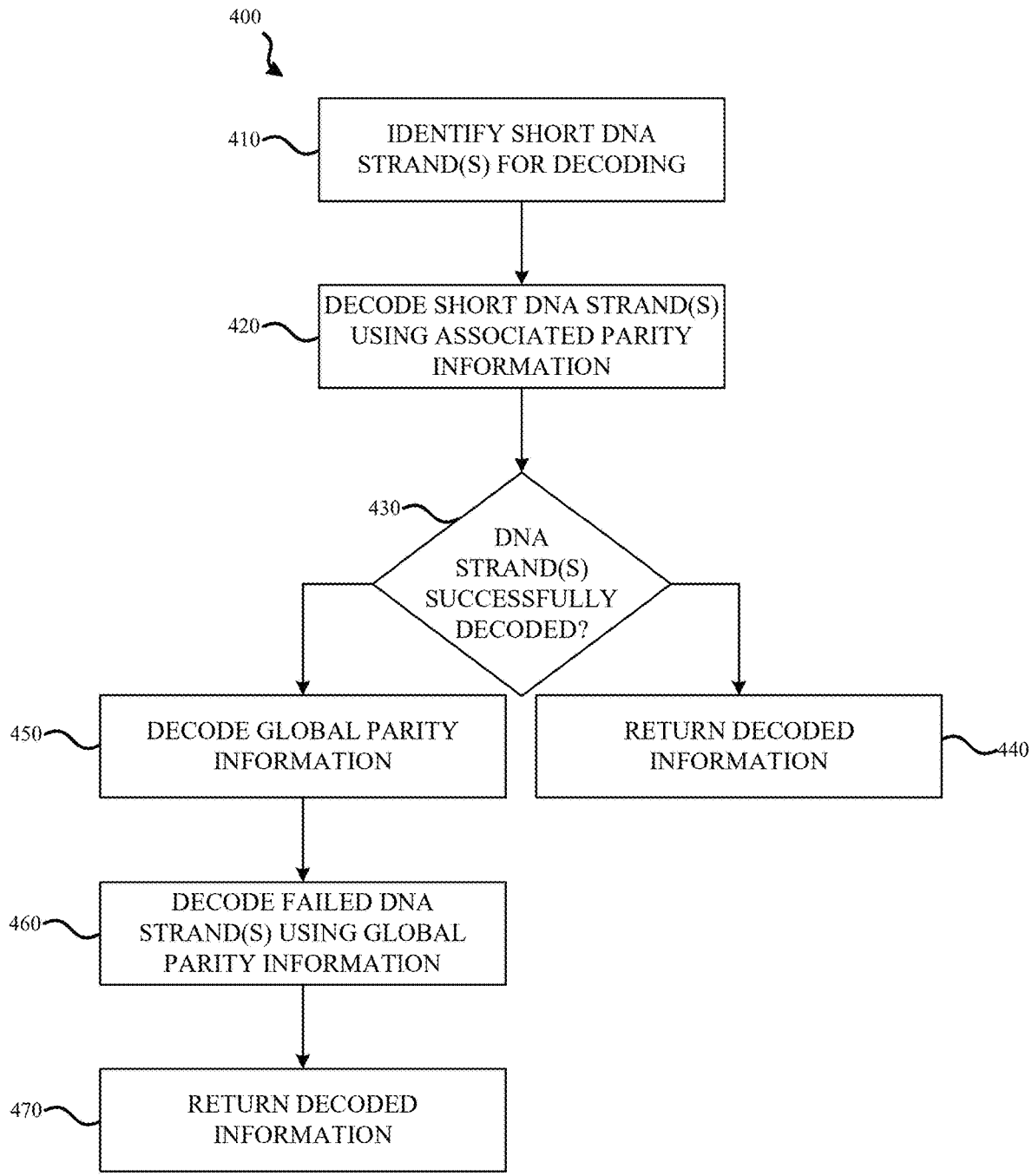
FIG. 4 illustrates a method for decoding one or more short DNA strands according to an example.

FIG. 4 illustrates a method 400 for decoding one or more short DNA strands according to an example. In an example, the method 400 may be executed by the data storage system 100, or various sub-systems of the data storage system 100, shown and described with respect to FIG. 1.

In an example the method 400 begins when a decoding and/or sequencing process has been initiated. As part of the sequencing and/or the decoding process, one or more DNA strands are accessed. In an example, the one or more DNA strands to be read is a long DNA strand such as, for example, the long DNA strand 280 shown and described with respect to FIG. 2.

A sequencing system is then used to select and/or read one or more of the DNA strands from, for example, a dense storage system. When the one or more DNA strands have been read, a decoding system maps the DNA symbols to digital data. Additionally, one or more short DNA strands associated with the long DNA strand are identified (410) and/or selected for decoding. In an example, each short DNA strand may have its own, unique parity information.

As such, each short DNA strand that is identified or otherwise selected is decoded (420) using its associated and unique parity information. For example a first DNA strand and a second DNA strand are each associated with a particular long DNA strand, each of the first DNA strand and the second DNA strand would be decoded using its own associated parity information.

In another example, the first DNA strand and the second DNA strand may be decoded and/or error corrected using a combination of local parity information and global parity information such as shown and described with respect to FIG. 3.

A decoding system may then determine (430) whether each of the first DNA strand and the second DNA strand were successfully decoded (e.g., whether any and/or all of the errors in the data were corrected using the parity information). If it is determined (430) that the first DNA strand and the second DNA strand were successfully decoded, the decoded information is returned (440) to a requesting device.

However, if the decoding system determines (430) that one or more of the identified DNA strands were not successfully decoded, a second decoding process is initiated. For example, if the decoding system determines that the first DNA strand was not successfully decoded, the second decoding process is initiated.

The second decoding process begins when global parity information is decoded (450). In an example, the global parity information includes data that is associated with some or all of the short DNA strands that make up the long DNA strand, along with the parity information associated with each short DNA strand.

When the global parity information is decoded, the DNA strands that failed the decoding process are decoded (460) using the global parity information. For example, if the first DNS strand was unsuccessfully decoded in the first decoding process, the global parity information is used to decode and/or correct any errors in the first DNA strand. Each DNA strand may then be returned (470) to a requesting device.

Figure 5:
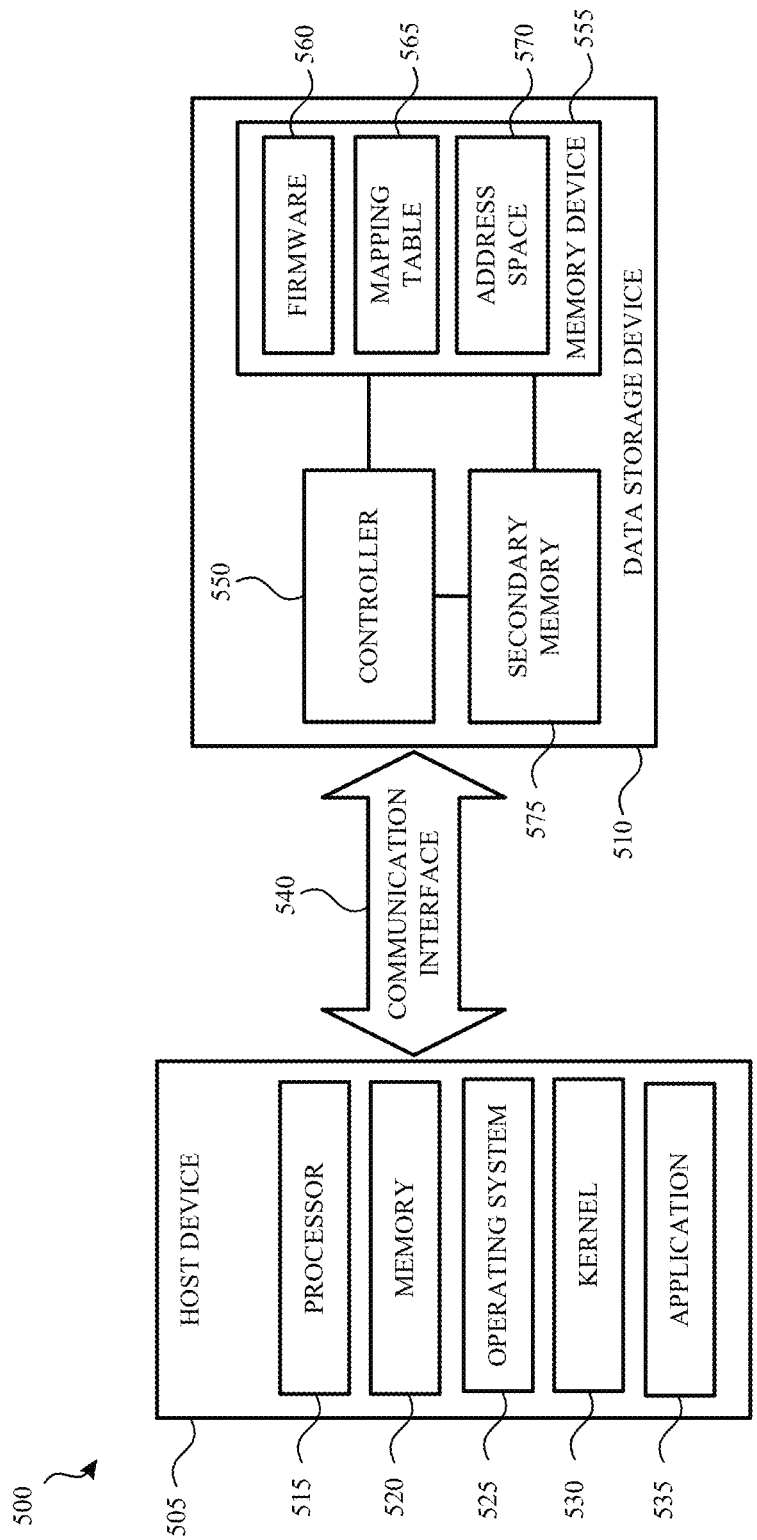
FIG. 5 is a block diagram of a system that includes a host device and a data storage device according to an example.

FIG. 5 is a block diagram of a system 500 that includes a host device 505 and a data storage device 510 according to an example. In an example, the host device 505 may be similar to the computing device 150 shown and described with respect to FIG. 1, and may be used to perform any or all of the operations described herein. Additionally, the data storage device 510 may be similar to the data storage device 100 shown and described with respect to FIG. 1. The host device 505 includes at least one processor 515 and at least one memory device 520 (e.g., main memory). The memory device 520 includes an operating system 525, a kernel 530 and/or an application 535.

The processor 515 can execute various instructions, such as, for example, instructions from the operating system 525 and/or the application 535. The processor 515 may include circuitry such as a microcontroller, a Digital Signal Processor (DSP), an Application-Specific Integrated Circuit (ASIC), a Field Programmable Gate Array (FPGA), hard-wired logic, analog circuitry and/or various combinations thereof. In an example, the processor 515 may include a System on a Chip (SoC).

In an example, the memory device 520 can be used by the host device 505 to store data used by the processor 515. Data stored in the memory device 520 may include instructions provided by the data storage device 510 via a communication interface 540. The data stored in the memory device 520 may also include data used to execute instructions from the operating system 525 and/or one or more applications 535. In an example, the memory 520 is volatile memory, such as, for example, Dynamic Random Access Memory (DRAM).

In an example, the operating system 525 may create a virtual address space for the application 535 and/or other processes executed by the processor 515. The virtual address space may map to locations in the memory device 520. The operating system 525 may include or otherwise be associated with a kernel 530. The kernel 530 may include instructions for managing various resources of the host device 505 (e.g., memory allocation), handling read and write requests and so on.

The communication interface 540 communicatively couples the host device 505 and the data storage device 510. The communication interface 540 may be a Serial Advanced Technology Attachment (SATA), a PCI express (PCIe) bus, a Small Computer System Interface (SCSI), a Serial Attached SCSI (SAS), Ethernet, Fibre Channel, or WiFi. As such, the host device 505 and the data storage device 510 need not be physically co-located and may communicate over a network such as a Local Area Network (LAN) or a Wide Area Network (WAN), such as the internet. In addition, the host device 505 may interface with the data storage device 510 using a logical interface specification such as Non-Volatile Memory express (NVMe) or Advanced Host Controller Interface (AHCI).

The data storage device 510 includes at least one controller 550 and at least one memory device 555 (e.g. volatile and/or non-volatile memory). The memory device 555 (and/or portions of the memory device 555) may also be referred to as a storage medium. The memory device 555 includes a number of storage elements. In an example, each storage element is a chip or a memory die that is used to store data.

For example, the memory device 555 may include a first memory die and a second memory die. In an example, the first memory die and the second memory die include non-volatile memory elements such as, for example, NAND flash memory elements and/or NOR flash memory elements. Although two memory dies are mentioned, the memory device 555 may include any number of storage elements. For example, the storage elements may take the form of solid-state memory such as, for example, 2D NAND, 3D NAND memory, multi-level cell memory, triple level cell memory, quad-level cell memory, penta-level cell memory or any combination thereof.

The controller 550 may include circuitry for executing instructions. The instructions may originate from firmware 560 associated with the data storage device 510. In another example, the instructions may originate from the host device 505. Accordingly, the controller 550 may include circuitry such as one or more processors, a microcontroller, a DSP, an ASIC, an FPGA, hard-wired logic, analog circuitry and/or a combination thereof. In another example, the controller 550 may include a SoC.

The data storage device 510 may also include secondary memory 575. The secondary memory 575 may be a rotating magnetic disk or non-volatile solid-state memory, such as flash memory. While the description herein refers to solid-state memory generally, it is understood that solid-state memory may comprise one or more of various types of memory devices such as flash integrated circuits, NAND memory (e.g., single-level cell (SLC) memory, multi-level cell (MLC) memory (i.e., two or more levels), or any combination thereof), NOR memory, EEPROM, other discrete Non-Volatile Memory (NVM) chips, or any combination thereof.

In some examples, the memory device 555 is capable of storing data at a byte-addressable level, as opposed to other types of non-volatile memory that have a smallest writable data size such as a page size of 4 KB or a sector size of 512 Bytes.

In some examples, the memory device 555 may also store a mapping table 565 and/or an address space 570. In some examples, the controller 550 can associate portions of data stored in the secondary memory 575 with unique identifiers. The unique identifiers may be stored in the memory device 555 and be used by the operating system 525 to access stored data. For example, the mapping table 565 can provide a mapping of unique identifiers with indications of physical locations (e.g., Physical Block Addresses (PBAs)) where the corresponding portions of data are stored in the memory device 555 and/or the secondary memory 575.

In some examples, the firmware 560 may store, maintain, be associated with or otherwise have access to a mapping table (e.g., mapping table 565) that stores and/or maintains mapping information for the various DNA strands such as described above.

As briefly discussed above, the memory device 555 may also include address space 570. The address space 570 can serve as at least a portion of an address space used by the processor 515. In an example, the address space 570 can store data at a byte-addressable level that can be accessed by the processor 515 (e.g., via the communication interface 540).

For example, the data storage device 510 may provide the host device 505 with an indication of the address space 570. The host device 505 may then associate an address range for the address space 570 and an indication that this address range is to be used as a byte-addressable address space, such as for a page cache.

In another example, the host device 505 may manage the data storage device 510 such that the processor 515 can directly access address space 570. For example, the data storage device 510 may provide logical to physical address translation information to the host device 505, which can be called by the host device 505 and executed by the processor 515 and/or the controller 550. In some examples, the controller 550 may include or otherwise be associated with a flash translation layer (FTL). The FTL may map the logical block addresses to the physical addresses of the memory device 555.

Although FIG. 5 illustrates the host device 505 being separate from the data storage device 510, the host device 505 and the data storage device 510, as well the various components described, may be part of a single device or part of multiple devices.

The term computer-readable media as used herein may include computer storage media. Computer storage media may include volatile and nonvolatile, removable and non-removable media implemented in any method or technology for storage of information, such as computer readable instructions, data structures, or program modules. Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by a computing device. Any such computer storage media may be part of the computing device. Computer storage media does not include a carrier wave or other propagated or modulated data signal.

Additionally, examples described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various examples.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

Examples of the present disclosure describe a DNA-based data storage system, comprising: a control system operable to: identify a DNA strand for decoding, the DNA strand being associated with global parity information; and a decoding system operable to: separate the DNA strand into two or more short DNA strands; and decode at least one short DNA strand of the two or more short DNA strands using local parity information that is unique to the at least one short DNA strand. In an example, the decoding system is further operable to: determine whether the at least one short DNA strand of the two or more short DNA strands was successfully decoded using the local parity information; and based, at least in part, on determining the decoding of the at least one short DNA strand of the two or more short DNA strands unsuccessful, decoding the at least one short DNA strand of the two or more short DNA strands using the global parity information. In an example, the global parity information is generated based, at least in part, on: the at least one short DNA strand of the two or more short DNA strands; the local parity information associated with the at least one short DNA strand of the two or more short DNA strands; at least another short DNA strand of the two or more short DNA strands; and local parity information associated with the at least another short DNA strand of the two or more short DNA strands. In an example, the decoding system is further operable to decode the at least one short DNA strand of the two or more short DNA strands separately from the at least another short DNA strand of the two or more short DNA strands. In an example, the DNA-based data storage system also includes an encoding system operable to divide the global parity information between the each of the two or more short DNA strands. In an example, the DNA-based data storage system also includes an encoding system operable to divide system parity information between the each of the two or more short DNA strands, based, at least in part, on determined performance metrics of the DNA-based data storage system, the system parity information including the global parity information and local parity information associated with each of the two or more short DNA strands. In an example, the global parity information corrects a first type of error and a second type of error in the at least one short DNA strand of the two or more short DNA strands.

Examples also describe a method of decoding a DNA strand, comprising: identifying the DNA strand, the DNA strand being associated with global parity information; separating the DNA strand into a first short DNA strand and a second short DNA strand; decoding at least the first short DNA strand with local parity information associated with the first short DNA strand; determining whether the decoding of the first short DNA strand was successful; and based, at least in part, on determining the decoding of first short DNA strand was unsuccessful, decoding the first short DNA strand using the global parity information. In an example, the global parity information is generated based, at least in part, on: the first short DNA strand; the local parity information associated with the first short DNA strand; the second short DNA strand; and the local parity information associated with the second short DNA strand. In an example, the local parity information associated with the first short DNA strand is unique to the first short DNA strand. In an example, the method also includes dividing the global parity information between the first short DNA strand and the second short DNA strand. In an example, the method also includes dividing system parity information between the first short DNA strand and the second short DNA strand based, at least in part, on determined performance metrics of a DNA-based data storage system, the system parity information including the global parity information, the local parity information associated with the first short DNA strand and local parity information associated with the second short DNA strand. In an example, the global parity information corrects indel errors and substitution errors.

Other examples describe a DNA-based data storage system, comprising: means for decoding a DNA strand using local parity information associated with the DNA strand; means for determining whether the decoding of the DNA strand was successful; and means for decoding the DNA strand using global parity information based, at least in part, on a determination that the decoding of the DNA strand using the local parity information was unsuccessful. In an example, the DNA strand is a first short DNA strand and the DNA-based data storage system also includes means for separating a long DNA strand into the first short DNA strand and a second short DNA strand. In an example, the first short DNA strand and the second short DNA strand are each associated with unique parity information. In an example, the global parity information is based, at least in part, on: the first short DNA strand; the local parity information associated with the first short DNA strand; the second short DNA strand; and local parity information associated with the second short DNA strand. In an example, the means for decoding is further operable to decode: the second short DNA strand; and the local parity information associated with the second short DNA strand. In an example, the global parity information corrects one or more of an indel error and a substitution error in the DNA strand. In an example, the DNA-based data storage system also includes means for encoding the DNA strand, wherein the means for encoding the DNA strand is operable to divide the global parity information between the DNA strand and another DNA strand.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an example with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/or schematic block diagrams of methods, apparatuses, systems, and computer program products according to examples of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute by way of the processor or other programmable data processing apparatus, create means for implementing the functions and/or acts specified in the schematic flowchart diagrams and/or schematic block diagrams block or blocks.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A deoxyribonucleic acid (DNA)-based data storage system, comprising:
   a control system operable to:
      identify a DNA strand for decoding, the DNA strand being associated with global parity information; and
   a decoding system operable to:
      separate the DNA strand into two or more short DNA strands; and
      decode at least one short DNA strand of the two or more short DNA strands using local parity information that is unique to the at least one short DNA strand.

2. The DNA-based data storage system of claim 1, wherein the decoding system is further operable to:
   determine whether the at least one short DNA strand was successfully decoded using the local parity information; and
   based, at least in part, on determining that the decoding of the at least one short DNA strand is unsuccessful, decode the at least one short DNA strand using the global parity information.

3. The DNA-based data storage system of claim 1, wherein the global parity information is generated based, at least in part, on:
   the at least one short DNA strand;
   the local parity information associated with the at least one short DNA strand;
   at least another short DNA strand of the two or more short DNA strands; and
   local parity information associated with the at least another short DNA strand.

4. The DNA-based data storage system of claim 3, wherein the decoding system is further operable to decode the at least one short DNA strand separately from the at least another short DNA strand.

5. The DNA-based data storage system of claim 1, further comprising an encoding system operable to divide the global parity information between each of the two or more short DNA strands.

6. The DNA-based data storage system of claim 1, further comprising an encoding system operable to divide system parity information between each of the two or more short DNA strands based, at least in part, on determined performance metrics of the DNA-based data storage system, the system parity information including the global parity information and local parity information associated with each of the two or more short DNA strands.

7. The DNA-based data storage system of claim 1, wherein the global parity information is configured to correct a first type of error and a second type of error in the at least one short DNA strand.

8. A method of decoding a deoxyribonucleic acid (DNA) strand, comprising:
   identifying the DNA strand, the DNA strand being associated with global parity information;
   separating the DNA strand into a first short DNA strand and a second short DNA strand;
   decoding at least the first short DNA strand with local parity information associated with the first short DNA strand;
   determining whether the decoding of the first short DNA strand was successful; and
   based, at least in part, on determining that the decoding of first short DNA strand was unsuccessful, decoding the first short DNA strand using the global parity information.

9. The method of claim 8, wherein the global parity information is generated based, at least in part, on:
   the first short DNA strand;
   the local parity information associated with the first short DNA strand;
   the second short DNA strand; and
   local parity information associated with the second short DNA strand.

10. The method of claim 8, wherein the local parity information associated with the first short DNA strand is unique to the first short DNA strand.

11. The method of claim 8, further comprising dividing the global parity information between the first short DNA strand and the second short DNA strand.

12. The method of claim 11, further comprising dividing system parity information between the first short DNA strand and the second short DNA strand based, at least in part, on determined performance metrics of a DNA-based data storage system, the system parity information including the global parity information, the local parity information associated with the first short DNA strand, and local parity information associated with the second short DNA strand.

13. The method of claim 8, wherein the global parity information corrects insertion/deletion (indel) errors and substitution errors.

14. A deoxyribonucleic acid (DNA)-based data storage system, comprising:
   means for decoding a DNA strand using local parity information associated with the DNA strand;
   means for determining whether the decoding of the DNA strand was successful; and
   means for decoding the DNA strand using global parity information based, at least in part, on a determination that the decoding of the DNA strand using the local parity information was unsuccessful.

15. The DNA-based data storage system of claim 14, wherein the DNA strand is a first short DNA strand and wherein the DNA-based data storage system further comprises means for separating a long DNA strand into the first short DNA strand and a second short DNA strand.

16. The DNA-based data storage system of claim 15, wherein the first short DNA strand and the second short DNA strand are each associated with unique parity information.

17. The DNA-based data storage system of claim 15, wherein the global parity information is based, at least in part, on:
- the first short DNA strand;
- the local parity information associated with the first short DNA strand;
- the second short DNA strand; and
- local parity information associated with the second short DNA strand.

18. The DNA-based data storage system of claim 17, wherein the means for decoding is further operable to decode:
- the second short DNA strand; and
- the local parity information associated with the second short DNA strand.

19. The DNA-based data storage system of claim 14, wherein the global parity information is configured to correct one or more of an insertion/deletion (indel) error and a substitution error in the DNA strand.

20. The DNA-based data storage system of claim 14, further comprising means for encoding the DNA strand, wherein the means for encoding the DNA strand is operable to divide the global parity information between the DNA strand and another DNA strand.

* * * * *